(12) United States Patent
Klaerner et al.

(10) Patent No.: US 10,763,236 B2
(45) Date of Patent: Sep. 1, 2020

(54) SYSTEMS AND METHODS OF OPERATING WIRE BONDING MACHINES INCLUDING CLAMPING SYSTEMS

(71) Applicant: Kulicke and Soffa Industries, Inc., Fort Washington, PA (US)

(72) Inventors: Peter J. Klaerner, Corona, CA (US); Jason Fu, Long Beach, CA (US); Christoph Benno Luechinger, Irvine, CA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 16/243,291

(22) Filed: Jan. 9, 2019

(65) Prior Publication Data

US 2019/0214363 A1 Jul. 11, 2019

Related U.S. Application Data

(60) Provisional application No. 62/615,350, filed on Jan. 9, 2018.

(51) Int. Cl.
*B23K 20/00* (2006.01)
*H01L 23/00* (2006.01)
(Continued)

(52) U.S. Cl.
CPC ............ *H01L 24/78* (2013.01); *B23K 20/004* (2013.01); *B23K 20/10* (2013.01); *B23K 20/26* (2013.01);
(Continued)

(58) Field of Classification Search
CPC .............. B23K 20/1255; B23K 20/127; B23K 2103/10; B23K 2103/20; B23K 20/125;
(Continued)

(56) References Cited

U.S. PATENT DOCUMENTS 4,737,845 A * 4/1988 Susuki ............... H05K 13/0812
348/87
4,872,052 A * 10/1989 Liudzius .............. G01N 21/956
348/126
(Continued)

FOREIGN PATENT DOCUMENTS

GB 9617166 * 9/1996 ....... H01L 21/67144
JP 2001-223238 A 8/2001
(Continued)

OTHER PUBLICATIONS

International Search Report dated May 15, 2019 for International Patent Application No. PCT/US2019/012854.

*Primary Examiner* — Kiley S Stoner
(74) *Attorney, Agent, or Firm* — Christopher M. Spletzer, Sr.

(57) ABSTRACT

A method of operating an ultrasonic bonding machine is provided. The method includes the steps of: (a) imaging at least one of (i) a semiconductor element supported by a substrate, and (ii) a clamping structure adapted for securing the substrate during a bonding operation; and (b) determining if a relative position of the semiconductor element and the clamping structure is acceptable using predetermined criteria and information from step (a).

15 Claims, 8 Drawing Sheets

(51) Int. Cl.
*B23K 20/10* (2006.01)
*B23K 20/26* (2006.01)
*B23K 101/40* (2006.01)
*H01L 23/367* (2006.01)

(52) U.S. Cl.
CPC .......... *H01L 24/85* (2013.01); *B23K 2101/40* (2018.08); *H01L 23/367* (2013.01); *H01L 2224/78313* (2013.01); *H01L 2224/78704* (2013.01); *H01L 2224/78753* (2013.01); *H01L 2224/78901* (2013.01); *H01L 2224/85123* (2013.01); *H01L 2224/85129* (2013.01); *H01L 2224/85205* (2013.01)

(58) Field of Classification Search
CPC .................. B23K 2103/04; B23K 1/06; B23K 20/10–106; B23K 20/004; B23K 20/005; B23K 20/007; G11B 33/022; G11B 33/1486; H01L 24/85
USPC ... 228/102–103, 105, 8–12, 4.5, 180.5, 904, 228/212–213, 44.3, 44.7
See application file for complete search history.

(56) References Cited

U.S. PATENT DOCUMENTS

| | | | | |
|---|---|---|---|---|
| 5,249,726 A | * | 10/1993 | Sato | H01L 21/67144 228/6.2 |
| 5,532,739 A | * | 7/1996 | Garakani | B23K 37/04 348/87 |
| 5,550,763 A | * | 8/1996 | Michael | G01N 21/88 702/155 |
| 5,640,199 A | * | 6/1997 | Garakani | G06T 7/30 348/87 |
| 5,702,049 A | * | 12/1997 | Biggs | B23K 20/007 228/105 |
| 5,796,161 A | * | 8/1998 | Moon | H01L 21/67144 257/676 |
| 5,816,477 A | * | 10/1998 | Shimizu | B23K 20/007 228/102 |
| 5,975,835 A | * | 11/1999 | Mochida | H01L 21/67721 414/751.1 |
| 6,542,783 B2 | | 4/2003 | Takahashi et al. | |
| 6,984,879 B2 | * | 1/2006 | Kim | H01L 22/20 228/212 |
| 7,980,444 B2 | * | 7/2011 | Ebihara | H05K 13/046 228/1.1 |
| 2001/0007084 A1 | * | 7/2001 | Koo | B23K 20/10 700/117 |
| 2002/0092595 A1 | * | 7/2002 | Fogal | H01L 21/67259 156/64 |
| 2004/0139782 A1 | | 7/2004 | Chen et al. | |
| 2006/0097028 A1 | * | 5/2006 | Kainuma | B23K 20/10 228/110.1 |
| 2009/0078743 A1 | * | 3/2009 | Ho | H01L 24/85 228/105 |
| 2009/0277951 A1 | * | 11/2009 | Ebihara | B23K 20/10 228/110.1 |
| 2010/0065613 A1 | * | 3/2010 | Nasu | H01L 24/81 228/110.1 |
| 2010/0140326 A1 | * | 6/2010 | Ebihara | H01L 24/75 228/111.5 |
| 2010/0301101 A1 | * | 12/2010 | Seyama | H01L 24/78 228/105 |
| 2012/0024089 A1 | * | 2/2012 | Couey | H01L 24/78 73/865.8 |
| 2013/0228611 A1 | | 9/2013 | Byars et al. | |
| 2014/0054277 A1 | * | 2/2014 | Sugito | H01L 24/78 219/136 |
| 2014/0076956 A1 | * | 3/2014 | Lu | B23K 1/0016 228/102 |
| 2014/0138426 A1 | * | 5/2014 | Hagiwara | H01L 24/78 228/160 |
| 2017/0154864 A1 | | 6/2017 | Hayata et al. | |
| 2017/0291251 A1 | * | 10/2017 | Hayata | B23K 20/002 |
| 2017/0365530 A1 | * | 12/2017 | Pellanda | H01L 22/12 |

FOREIGN PATENT DOCUMENTS

| | | |
|---|---|---|
| JP | 6240866 B2 | 12/2017 |
| KR | 10-2001-0058948 A | 7/2001 |
| KR | 20010058472 A * | 7/2001 ............ H01L 24/85 |

\* cited by examiner

SYSTEMS AND METHODS OF OPERATING WIRE BONDING MACHINES INCLUDING CLAMPING SYSTEMS

CROSS-REFERENCE TO RELATED APPLICATION

This application claims the benefit of U.S. Provisional Application No. 62/615,350 filed on Jan. 9, 2018, the content of which is incorporated herein by reference.

FIELD

The invention relates to ultrasonic bonding, and more particularly, to improved clamping operations for ultrasonic wire bonding.

BACKGROUND

In the processing and packaging of semiconductor devices, ultrasonic wire bonding (e.g., ball bonding, wedge bonding, ribbon bonding, etc.) continues to be a widely used method of providing electrical interconnection between two locations (e.g., between a die pad of a semiconductor die and a lead of a leadframe).

In wire bonding operations, an upper end of a wire bonding tool is, in many instances, configured to be engaged in a transducer (e.g., an ultrasonic transducer) of an ultrasonic bonding system which causes the wire bonding tool to vibrate during bonding. Ultrasonic bonding is a joining process that, for example, may use relative motion between the wire and an underlying surface to facilitate bonding to that underlying surface. Wedge bonding is one well known type of wire bonding.

In connection with ultrasonic wire bonding (e.g., wedge bonding) it is typical for a semiconductor die (or other semiconductor element) to be mounted on a substrate, such as a leadframe substrate. In certain applications, a portion of the substrate supporting the semiconductor die may be considered a heat sink.

It is desirable to secure the substrate (including the semiconductor die) in place on the ultrasonic wire bonding machine. Clamping structures (e.g., clamp fingers) may be used to provide this clamping. It is sometimes desirable to have the clamping structures close to the semiconductor die to provide strong clamping forces, for example, to provide an effective and robust wire bonding process. Unfortunately, the close proximity of the clamping structures may result in damage to the semiconductor die.

Thus, it would be desirable to provide improved wire bonding systems, and methods of operating such wire bonding systems, in particular with respect to clamping operations of the wire bonding systems.

SUMMARY

According to an exemplary embodiment of the invention, a method of operating an ultrasonic bonding machine is provided. The method includes: (a) imaging at least one of (i) a semiconductor element supported by a substrate, and (ii) a clamping structure adapted for securing the substrate during a bonding operation; and (b) determining if a relative position of the semiconductor element and the clamping structure is acceptable using predetermined criteria and information from step (a).

According to another exemplary embodiment of the invention, an ultrasonic bonding machine is provided. The ultrasonic bonding machine includes the steps of: a support structure for supporting a substrate, the substrate configured to carry a semiconductor element; a clamping structure for securing the substrate to against the support structure during a bonding operation; an imaging system for imaging at least one of (i) a semiconductor element supported by a substrate, and (ii) a clamping structure adapted for securing the substrate during a bonding operation; and a computer for determining if a relative position of the semiconductor element and the clamping structure is acceptable using predetermined criteria and information from the imaging system.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

As used herein, the term "semiconductor element" is intended to refer to any type of semiconductor device that may be attached to (or otherwise supported by) a substrate in connection with an ultrasonic bonding operation such as an ultrasonic wire bonding operation. Exemplary semiconductor elements include bare semiconductor die, a packaged semiconductor die, partially packaged semiconductor die, etc. As will be appreciated by those skilled in the art, in connection with wire bonding operations, the wire bonding machine is configured to bond wires between the semiconductor element and the substrate (e.g., a leadframe, another semiconductor element, etc.).

As used herein, the term "computer" is intended to broadly refer to any type of device or system configured for determining (e.g., using software and/or other logic) if the relative position of a semiconductor element and a clamping structure is acceptable. The determination may be made using predetermined criteria (e.g., required spacing, acceptable areas, etc.). Exemplary computers include personal computers, programmable logic controllers, other programmable processor based systems, etc. The computer may be integrated as part of the wire bonding machine (e.g., an existing computer included in the wire bonding machine, such as computer 114 shown in FIG. 1), and/or a computer that is separate from the wire bonding machine.

In accordance with certain exemplary embodiments of the invention, a pattern recognition (or other imaging) procedure is provided. The procedure involves measuring the relative position of (i) a semiconductor element (e.g., a semiconductor die) on a substrate (e.g., a heat sink) to (ii) a clamping structure (e.g., one or more clamp fingers) to identify a potential problem, to alarm a user, and/or to trigger corrective actions.

For example, the placement of a semiconductor die on a substrate can vary, and as such, if the clamping structures are positioned in close proximity to the semiconductor die, damage to the semiconductor die may result.

In accordance with various aspects of the invention, imaging operations are performed on the ultrasonic bonding machine (e.g., a wire bonding machine, such as a wedge bonding machine). The imaging operations are used to determine if the relative position of the semiconductor element (e.g., semiconductor die) and the clamping structure is acceptable using predetermined criteria.

A purpose of the invention is to reduce the potential for a damaged semiconductor element to reach the field, with the damage undetected. For example, slightly damaged devices may pass an electrical test, but still may fail in the field under operating conditions (e.g., thermal stress, etc.). In accordance with aspects of the invention, assemblies (including a semiconductor element) are identified where a clamping structure (e.g., a clamp finger) comes too close to the semiconductor die, or where the clamping structure may even contact the semiconductor die. Upon detection of such a condition, a user may be alarmed, for example: (a) to not bond the device, (b) to mark the device, and/or (c) to take some corrective action(s).

Clamp fingers are often utilized in ultrasonic bonding (e.g., wedge wire bonding) to firmly hold the substrate in place during bonding. The clamp fingers are desirably placed at fixed mechanical positions at a clamp station. Consequently, the relative position to a semiconductor element on a substrate (e.g., a semiconductor die on a heat sink) can vary from index to index due to indexing variations, and/or from device to device due to die placement variations from the prior die attach. Further, the clamping structure position may vary (e.g., due to operator error, set-up issues, etc.). According to aspects of the invention, the relative position of the die to the clamp fingers nearest to the die are measured, for example, for every device. This will allow critical devices to be identified.

Many users of ultrasonic wire bonding machine are reluctant to allow clamping on the heat sink of a substrate. Example industry trends include thinner heat sinks, die with larger areas, stronger warpage of heat sink due to the CTE mismatch, and soft solder die attach processes. These trends make ultrasonic bonding without clamping on the heat sink more and more difficult.

The proposed improved clamping schemes provide a check to give the wire bonding machine user greater confidence. The invention has particular applicability in lead frame based wedge bonding applications where clamps are placed on the heat sink and/or close to a die.

The invention may utilize an on bonder imaging system (e.g., a camera) to image the "clamped configuration"; however, alternative approaches are contemplated. For example, one variation is to use pattern recognition (PR) prior to even closing the clamp, thereby substantially preventing the potential for die damage by clamping. For example, this could also be done with an upstream PR camera that checks for outlying dice that have the potential to interfere with the clamps. Such a camera could also check for other die defects (e.g., inked die avoiding the bond head, faulty die, etc.).

Figure 1:
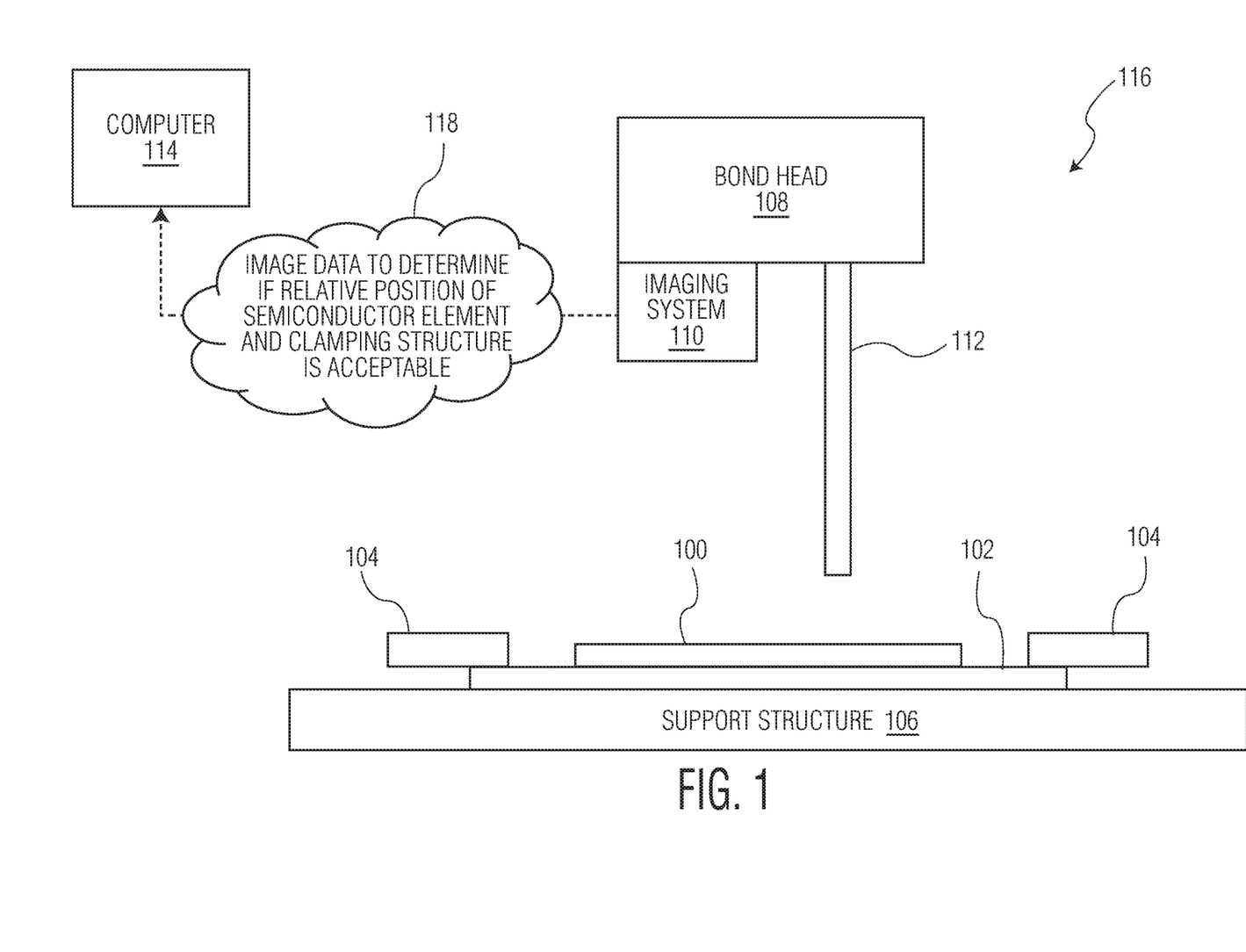
FIG. 1 is a block diagram side view of elements of a wire bonding machine in accordance with an exemplary embodiment of the invention.

Referring now to the drawings, FIG. 1 illustrates elements of ultrasonic wire bonding machine 116 (e.g., a wedge wire bonding machine). Wire bonding machine 116 includes a support structure 106 configured to support a substrate 102 (e.g., a leadframe substrate). Semiconductor element 100 (e.g., a semiconductor die) has been attached to substrate 102. Clamping structures 104 secure substrate 102 against support structure 106 of wire bonding machine 116 during a wire bonding operation. Wire bonding machine 116 also includes a bond head 108 for carrying a wire bonding tool 112 (e.g., a wedge bonding tool, also known as a wedge) for bonding portions of wire to semiconductor element 100 and/or substrate 102. Bond head 108 also carries elements of an imaging system 110 (e.g., a camera). For example, imaging system 110 may include optical elements such as lenses, camera elements, and other optical elements.

Imaging system 110 is configured to image at least one of (i) semiconductor element 100 supported by substrate 102, and (ii) clamping structure(s) 104 adapted for securing substrate 102 during a wire bonding operation, thereby generating image data. The imaging of semiconductor element 100 and/or clamping structure(s) 104 may be of the entire element/structure, or may be imaging of the portion of the element/structure to be used in the operations described herein. Thus, it is clear that only a portion of semiconductor element 100 and/or clamping structure(s) 104 may be imaged by imaging system 110, if desired. The imaging operation may be performed in a single field of view, or through multiple fields of view, using imaging system 110 (e.g., camera 110). Image data 118 is provided from imaging system 110 to computer 114 for use in determining if the relative position of semiconductor element 100 and clamping structure(s) 104 is acceptable. Computer 114 determines if the relative position of semiconductor element 100 and clamping structure(s) 104 is acceptable using predetermined criteria and information. The predetermined criteria and/or information is stored at, or accessible by, computer 114.

FIGS. 2A-2C and FIGS. 3A-3C are top views of elements of wire bonding machine 116 of FIG. 1, with other elements removed for simplicity. In FIGS. 2B-2C and FIGS. 3A-3C one of the clamping structures 104 from FIG. 1 (and FIG. 2A) has been replaced by a plurality of clamping structures 104a (e.g., clamping fingers 104a). As will be appreciated by those skilled in the art, any type of clamping structure may be utilized to secure a substrate to a support structure in connection with the invention. Exemplary clamping structures include clamping fingers, clamp blocks, clamp inserts, window clamps, device clamps, among others.

Figure 2A:
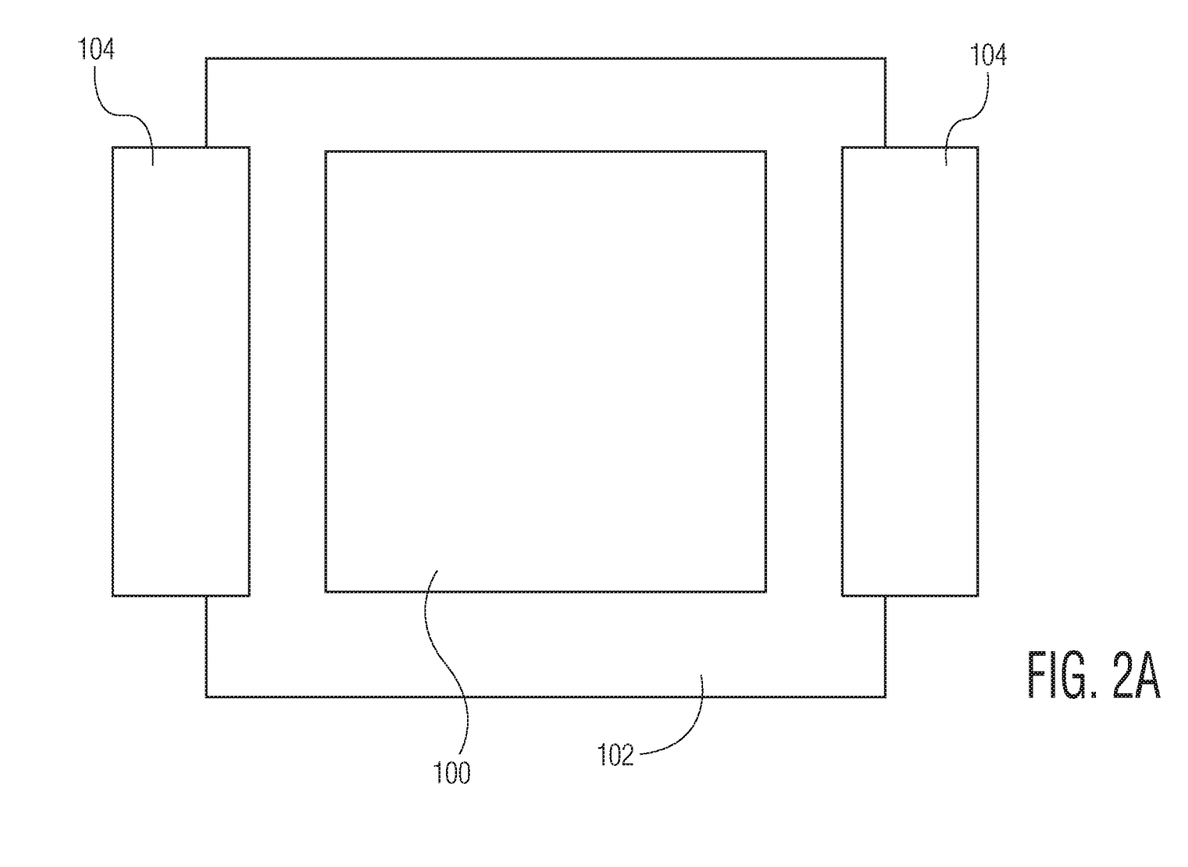
FIGS. 2A-2C are block diagram illustrations of elements of the wire bonding machine of FIG. 1 in accordance with various exemplary embodiments of the invention.
Figure 2B:
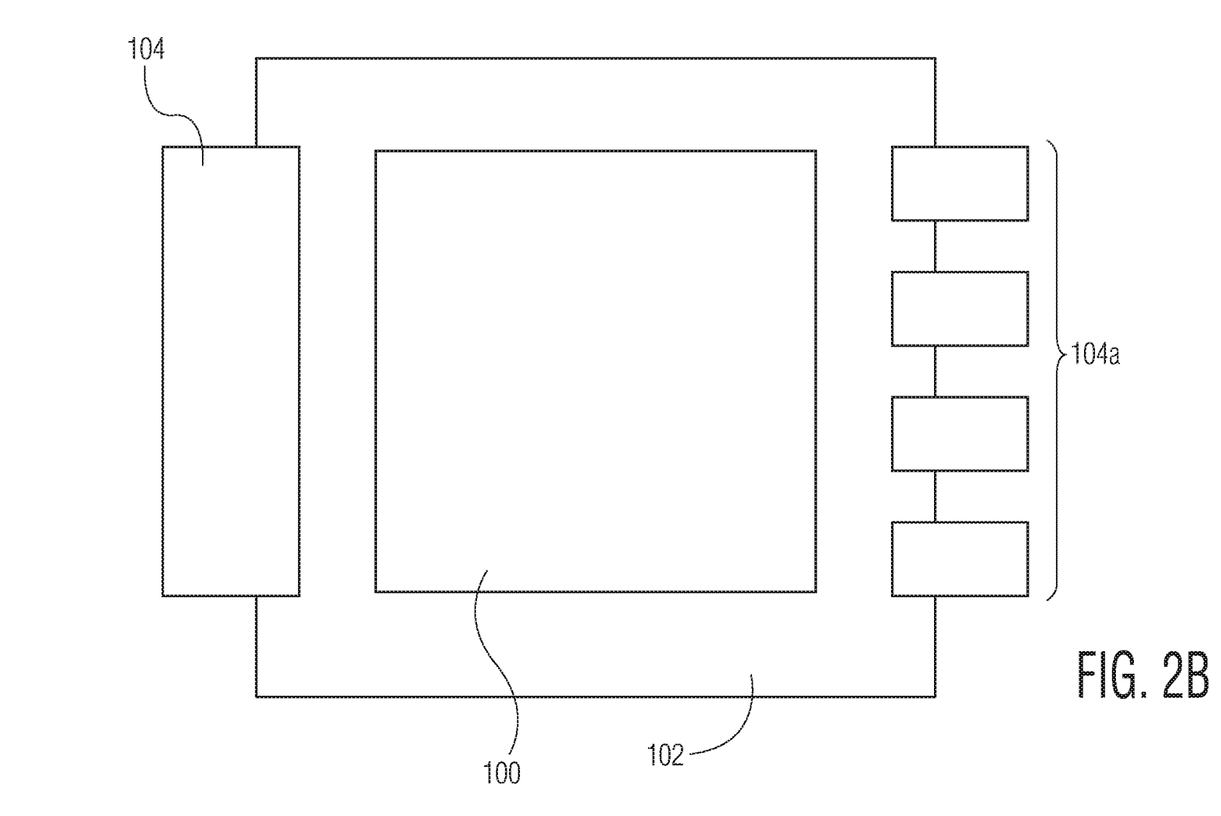
Figure 2C:
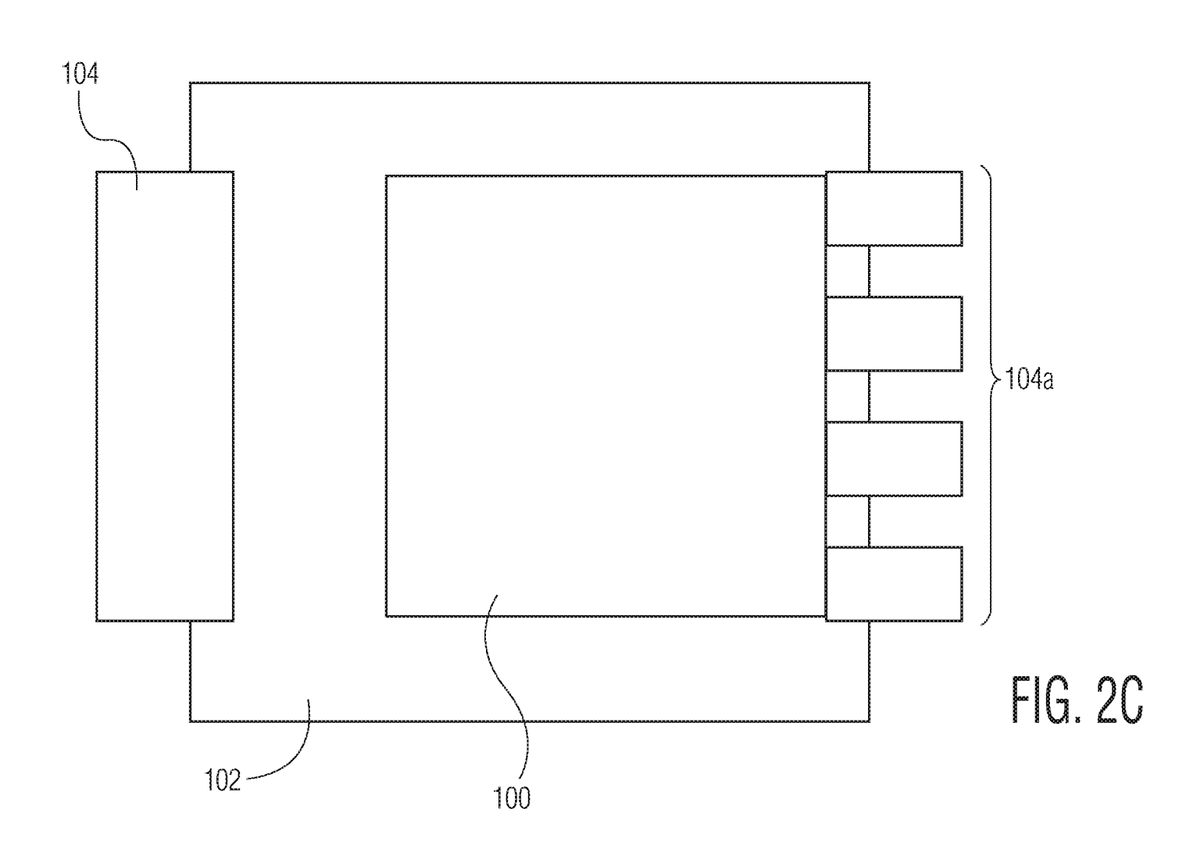

FIG. 2A illustrates semiconductor element 100 (e.g., a semiconductor die) on substrate 102. Clamping structures 104 are provided to secure substrate 102 (e.g., against support structure 106, not shown in FIGS. 2A-2C, and FIGS. 3A-3C) during a bonding operation. In FIG. 2A there is an adequate space (as determined by some predetermined criteria) between clamping structures 104 and semiconductor element 100. FIG. 2B illustrates alternative clamping structures 104a (e.g., clamping fingers) on the right hand side of semiconductor element 100. In FIG. 2B there is an adequate space (as determined by some predetermined criteria) between clamping structures 104, 104a and semiconductor element 100. FIG. 2C, with the same elements as FIG. 2B, illustrates the semiconductor element 100 being positioned too close to (and in fact in contact with) certain of the clamping structures 104a.

Figure 3A:
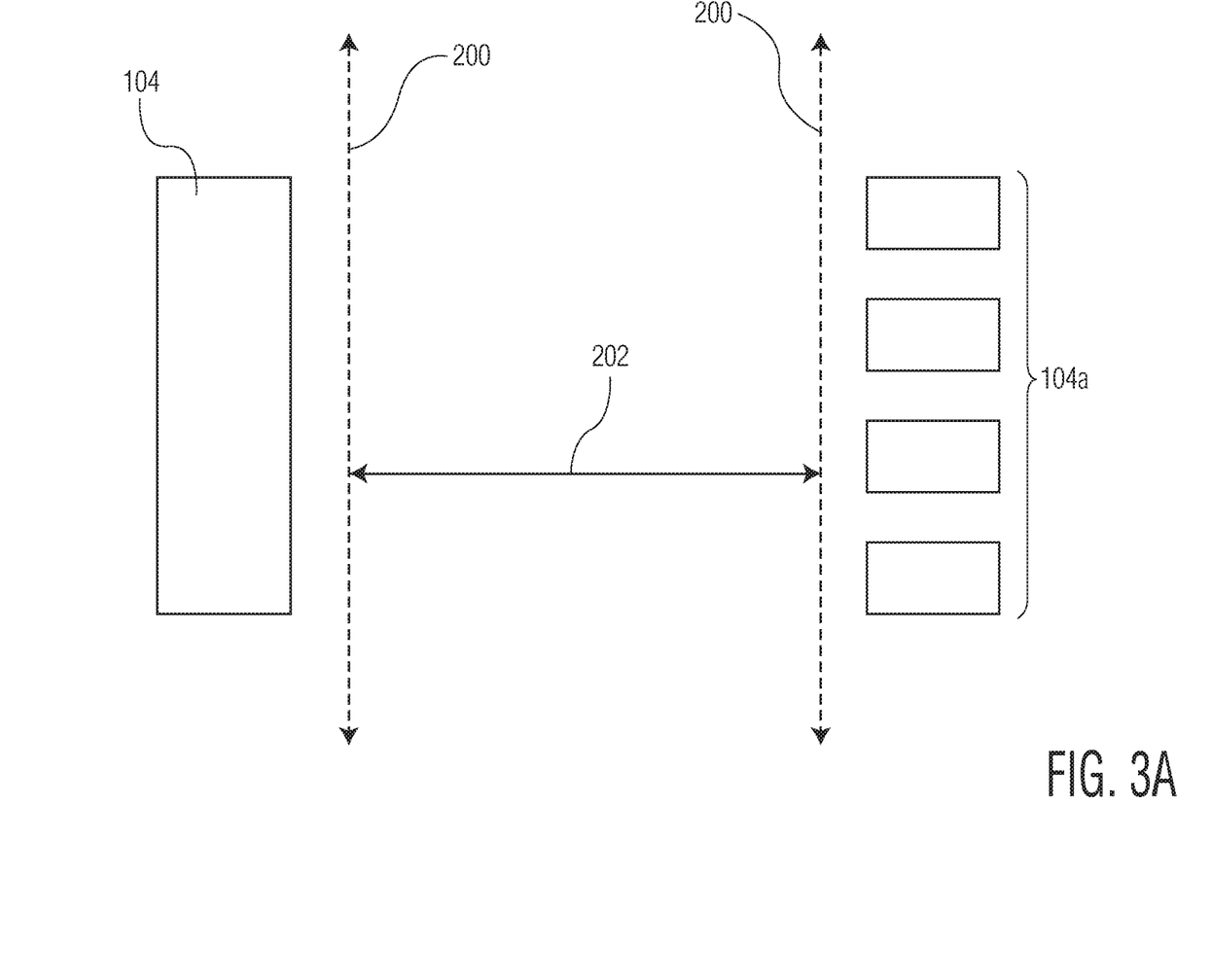
FIGS. 3A-3C are block diagram illustrations of elements of the wire bonding machine of FIG. 1 useful for illustrating methods of operating the wire bonding machine in accordance with various exemplary embodiment of the invention.
Figure 3B:
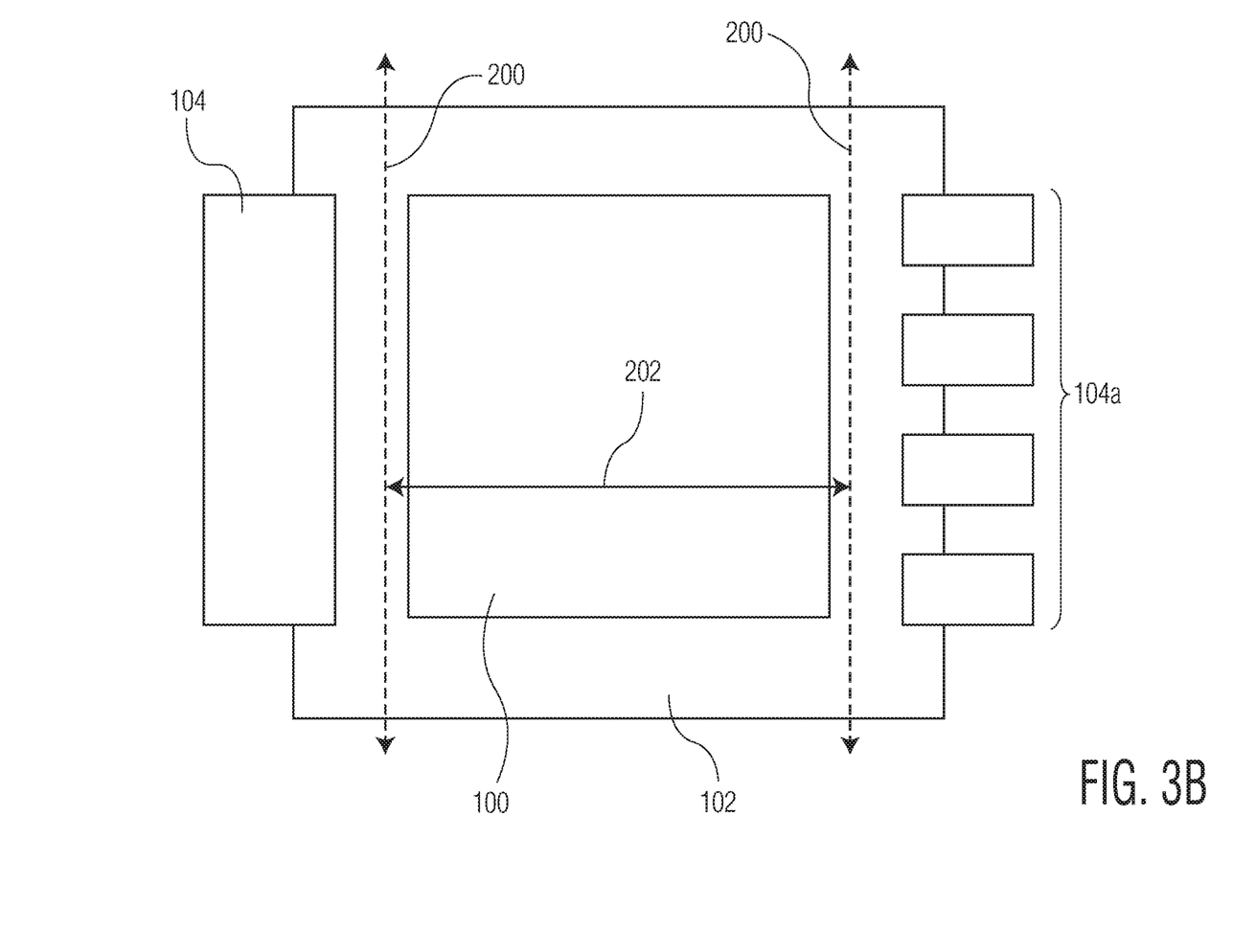
Figure 3C:
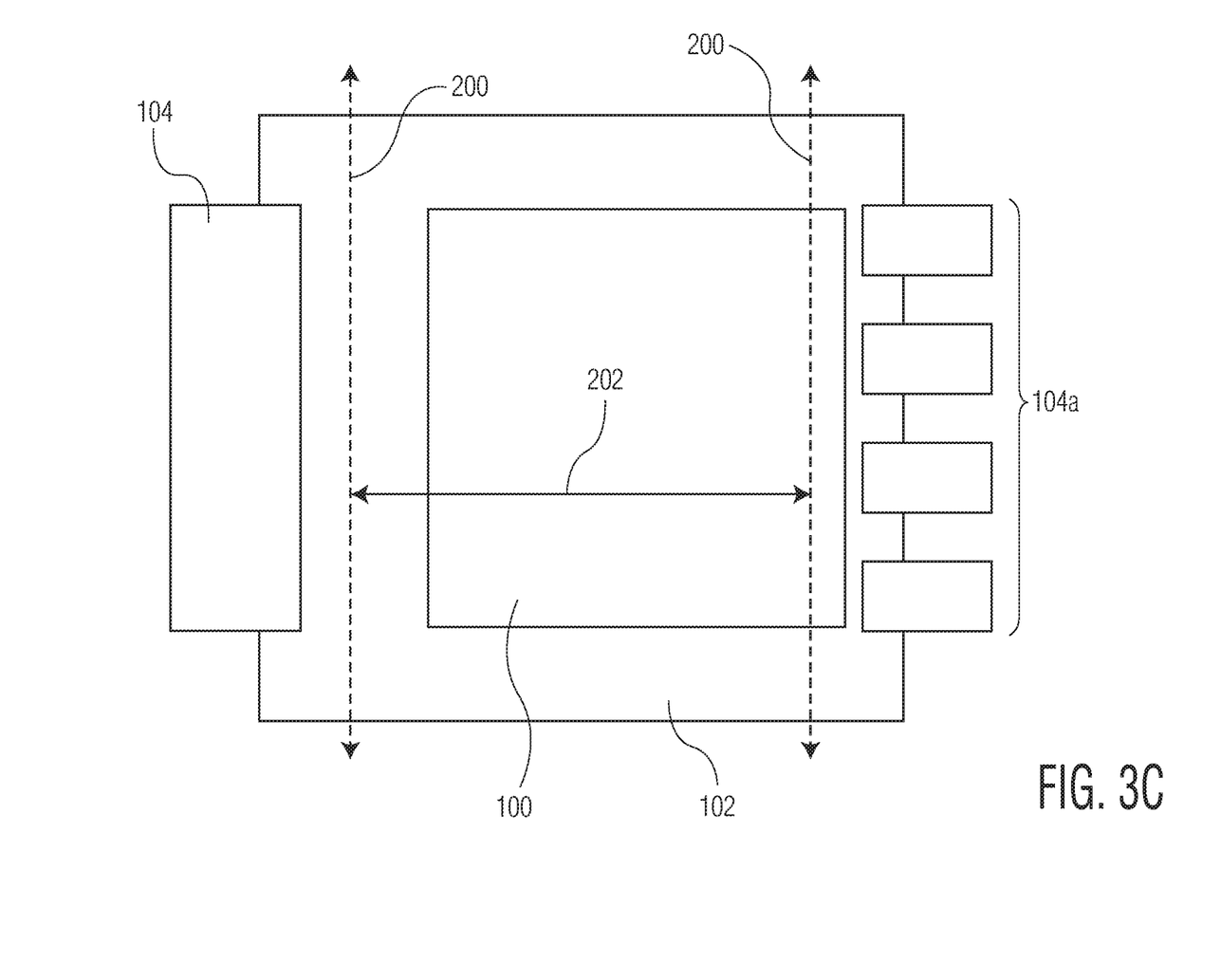

As described herein, in accordance with exemplary aspects of the invention, an acceptable relative position of a semiconductor element and the clamping structure(s) is established. For example, this acceptable relative position may be established by defining an acceptable area for the semiconductor element with respect to the clamping structure. FIGS. 3A-3C illustrate an example of such an acceptable relative position, and a semiconductor element outside of such an acceptable relative position (FIG. 3C).

FIG. 3A illustrates a general configuration of clamping structures 104, 104a on the ultrasonic bonding machine (e.g., in connection with known XY positioning of the ultrasonic bonding machine). In certain applications, there tends to be little variation in the location of clamping structures 104, 104a. Thus, their location may be used to define an acceptable area 202 for the semiconductor element 100. For example, acceptable area 202 in FIG. 3A is defined by (or bound by) tolerance markings 200. Tolerance markings 200 are determined using the location of the clamping structures 104, 104a. As will be appreciated by those skilled in the art, tolerance markings 200 are likely to be imaginary markings; that is, they are illustrative only but indicate that actual tolerance locations considered (e.g., by a computer) in the determination of whether the semiconductor die is in the acceptable area 202. However, it will be appreciated that such tolerance markings 200 could be incorporated into an overlay (or the like) such that the actual image of the semiconductor die 100 may be viewed with respect to the tolerance markings 200, if desired.

In FIG. 3B, semiconductor element 100 is shown within acceptable area 202 (e.g., semiconductor element 100 is shown within tolerance markings 200). However, due to a placement inaccuracy or some other reason, in FIG. 3C, semiconductor element 100 is not within acceptable area 202.

Although FIGS. 3A-3C illustrate an example of an "acceptable area" 202 defined by two tolerance markings 200 (where the tolerance markings are used to bound the acceptable area along one axis), other configurations are contemplated. For example, tolerance markings may be included along a plurality of axes to define the acceptable area.

Further, the acceptable relative position of a semiconductor element with respect to the clamping structure(s) may be established in other ways—that is, ways other than defining an "acceptable area". For example, image data may be used to determine if there is a minimum threshold distance (e.g., separation) between the clamping structures and the semiconductor element. Of course, other examples are contemplated.

Figure 4:
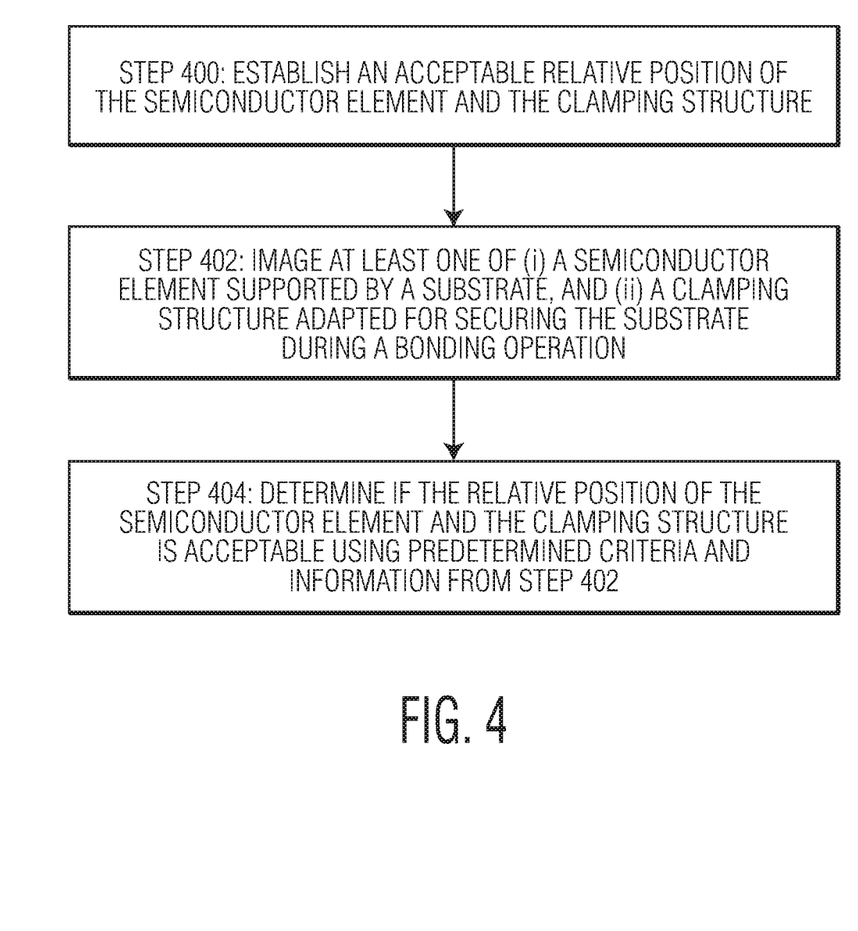
FIG. 4 is a flow diagram illustrating a method of operating an ultrasonic bonding machine in accordance with an exemplary embodiment of the invention.

FIG. 4 is a flow diagram in accordance with an exemplary embodiment of the invention. As is understood by those skilled in the art, within the scope of the invention, certain steps included in the flow diagram may be omitted; certain additional steps may be added; and the order of the steps may be altered from the order illustrated.

FIG. 4 illustrates a method of operating an ultrasonic bonding machine (e.g., a wire bonding machine, such as a wedge bonding machine). At Step 400, an acceptable relative position of a semiconductor element and a clamping structure is established. For example, such an acceptable relative position may be established by defining an acceptable area (e.g., using tolerance markings, such as in FIGS. 3A-3C), or through other ways. At Step 402, at least one of (i) a semiconductor element supported by a substrate, and (ii) a clamping structure adapted for securing the substrate during a bonding operation, is imaged. For example, any desired portion may be imaged using an imaging system (e.g., see imaging system 110 in FIG. 1) to generate image data (e.g., see image data 118 in FIG. 1). At Step 404, a determination is made (e.g., using computer 114 in FIG. 1) as to whether the relative position of the semiconductor element and the clamping structure is acceptable. The determination is made using predetermined criteria (e.g., the established acceptable position from Step 400) and information (e.g., the image data from Step 402) from Step 402. For example: if Step 400 includes defining an acceptable area as the acceptable relative position of the semiconductor element; and Step 402 includes imaging at least a portion of the semiconductor element—then Step 404 may include determining whether the semiconductor element is positioned within the acceptable area.

If the determination indicates that the relative position is not acceptable (e.g., see FIG. 3C), this information may be used, for example: to identify a potential problem prior to bonding; to alarm a user/operator of the ultrasonic bonding machine; and/or to trigger corrective actions.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a wire bonding machine, the method comprising the steps of: (a) imaging each of (i) a semiconductor element supported by a substrate, and (ii) a clamping structure adapted for securing the substrate during a bonding operation; and (b) determining if a relative position of the semiconductor element and the clamping structure is acceptable using predetermined criteria and information from step (a), establishing an acceptable relative position of the semiconductor element and the clamping structure prior to step (a), wherein the clamping structure includes at least one clamping finger for securing the substrate during the bonding operation.

2. The method of claim 1 wherein step (a) includes imaging a portion of the semiconductor element.

3. The method of claim 1 wherein step (a) includes imaging a portion of the clamping structure.

4. The method of claim 1 wherein step (a) includes imaging each of the semiconductor element and the clamping structure in a single field of view using a camera of the ultrasonic bonding machine.

5. The method of claim 1 wherein step (a) includes imaging each of the semiconductor element and the clamping structure using multiple fields of view using a camera of the ultrasonic bonding machine.

6. The method of claim 1 wherein the acceptable relative position is defined by an acceptable area for the semiconductor element with respect to the clamping structure.

7. The method of claim 6 wherein step (a) includes imaging at least a portion of the semiconductor element, and wherein step (b) includes determining if the semiconductor element is within the acceptable area using information from step (a).

8. The method of claim 1 wherein the predetermined criteria relates to an acceptable area for the semiconductor element with respect to the clamping structure.

9. The method of claim 1 wherein the predetermined criteria includes a minimum threshold distance between the semiconductor element and the clamping structure.

10. The method of claim 1 wherein the ultrasonic bonding machine includes a plurality of the clamping structures adapted for securing the substrate during the bonding operation.

11. The method of claim 10 wherein step (a) includes imaging at least one of (i) the semiconductor element supported by a substrate, and (ii) each of the plurality of clamping structures.

12. The method of claim 1 wherein the semiconductor element includes a semiconductor die, and the substrate includes a heatsink for supporting the semiconductor die.

13. The method of claim 1 wherein the clamping structure includes a plurality of clamping fingers for securing the substrate during the bonding operation.

14. The method of claim 1 wherein the wire bonding machine is a wedge wire bonding machine.

15. An ultrasonic wire bonding machine comprising: a support structure for supporting a substrate, the substrate configured to carry a semiconductor element; a clamping structure for securing the substrate against the support structure during a bonding operation, wherein the clamping structure includes at least one clamping finger for securing the substrate during the bonding operation; an imaging system for imaging each of (i) a semiconductor element supported by a substrate, and (ii) a clamping structure adapted for securing the substrate during a bonding operation; and a computer configured to determine if a relative position of the semiconductor element and the clamping structure is acceptable using predetermined criteria and information from the imaging system.

* * * * *